United States Patent [19]

Huppenthal

[11] Patent Number: 5,162,728
[45] Date of Patent: Nov. 10, 1992

[54] FUNCTIONAL AT SPEED TEST SYSTEM FOR INTEGRATED CIRCUITS ON UNDICED WAFERS

[75] Inventor: Jon Huppenthal, Colorado Springs, Colo.

[73] Assignee: Cray Computer Corporation, Colorado Springs, Colo.

[21] Appl. No.: 580,765

[22] Filed: Sep. 11, 1990

[51] Int. Cl.$^5$ .............................. G01R 1/02; G01R 1/04
[52] U.S. Cl. .............................. 324/158 R; 324/158 P; 324/158 F; 439/482
[58] Field of Search .............. 324/158 R, 158 F, 73.1, 324/72.5, 158 P; 437/8; 371/1, 15.1, 16.1, 27, 25.1; 439/482, 824; 361/397, 400, 401; 174/52.4, 52.2

[56] References Cited

U.S. PATENT DOCUMENTS

| | | | |
|---|---|---|---|
| 3,676,777 | 7/1972 | Charters | 324/158 P |
| 3,963,986 | 6/1976 | Morton et al. | 324/158 F |
| 3,975,680 | 8/1976 | Webb | 324/158 R |
| 4,473,798 | 9/1984 | Cedrone et al. | 324/158 P |
| 4,497,056 | 1/1985 | Sugamori | 371/25.1 |
| 4,504,783 | 3/1985 | Zasio et al. | 324/158 F |
| 4,567,432 | 1/1986 | Buol et al. | 324/158 F |
| 4,574,235 | 3/1986 | Kelly et al. | 324/158 F |
| 4,593,243 | 6/1986 | Lao et al. | 324/158 P |
| 4,672,312 | 4/1987 | Takamine et al. | 324/158 F |
| 4,684,884 | 8/1987 | Soderlund | 324/158 R |
| 4,697,143 | 9/1987 | Lockwood et al. | 324/158 F |
| 4,719,411 | 1/1988 | Buehler | 324/158 R |
| 4,731,577 | 3/1988 | Logan | 324/158 F |
| 4,733,172 | 3/1988 | Smolley | 324/158 P |
| 4,739,257 | 4/1988 | Jenson et al. | 324/158 F |
| 4,764,723 | 8/1988 | Strid | 324/158 P |
| 4,769,591 | 9/1988 | Binet et al. | 324/158 F |
| 4,775,977 | 10/1988 | Dehara | 371/27 |
| 4,780,670 | 10/1988 | Cherry | 324/158 F |
| 4,807,229 | 2/1989 | Tada | 371/27 |
| 4,825,155 | 4/1989 | Takamine | 324/158 F |
| 4,827,211 | 5/1989 | Strid et al. | 324/158 P |
| 4,829,242 | 5/1989 | Carey et al. | 324/158 P |
| 4,862,075 | 8/1989 | Choi et al. | 324/158 R |
| 4,870,354 | 9/1989 | Davaut | 324/158 F |
| 4,970,460 | 11/1990 | Jensen et al. | 324/158 F |
| 5,014,002 | 5/1991 | Wiscombe et al. | 324/158 P |

OTHER PUBLICATIONS

Rosner; "DVM Locates Short Circuit on Wired Circuit Board"; Electronics; Sep. 16, 1976; pp. 118–119.

Primary Examiner—Vinh Nguyen
Attorney, Agent, or Firm—John R. Ley

[57] ABSTRACT

A digital test system for functionally testing undiced ICs on wafers at relatively high test frequencies includes an improved probe card and interface assemblies. The probe card and interface assemblies each include a plurality of printed circuit boards laminated together as a single laminated structure. Equal length and equal impedance elongated micro strip test signal traces conduct the signals to and from a probe ring with a plurality of resilient probes physically and electrically in contact with the contact pads of the IC. Other circuit patterns includes a relatively large reference plane and a power plane of approximately equal size. The interface assembly performs selective I/O functions to electrically conduct input signals from a test signal generator to the probe card assembly and to electrically conduct response signals from the probe card assembly to the signal analyzer for determining the proper functionality of the IC. The printed circuit techniques assures a high degree of signal integrity, control over the signals at very high test frequencies, and efficiency in signal path routing.

36 Claims, 8 Drawing Sheets

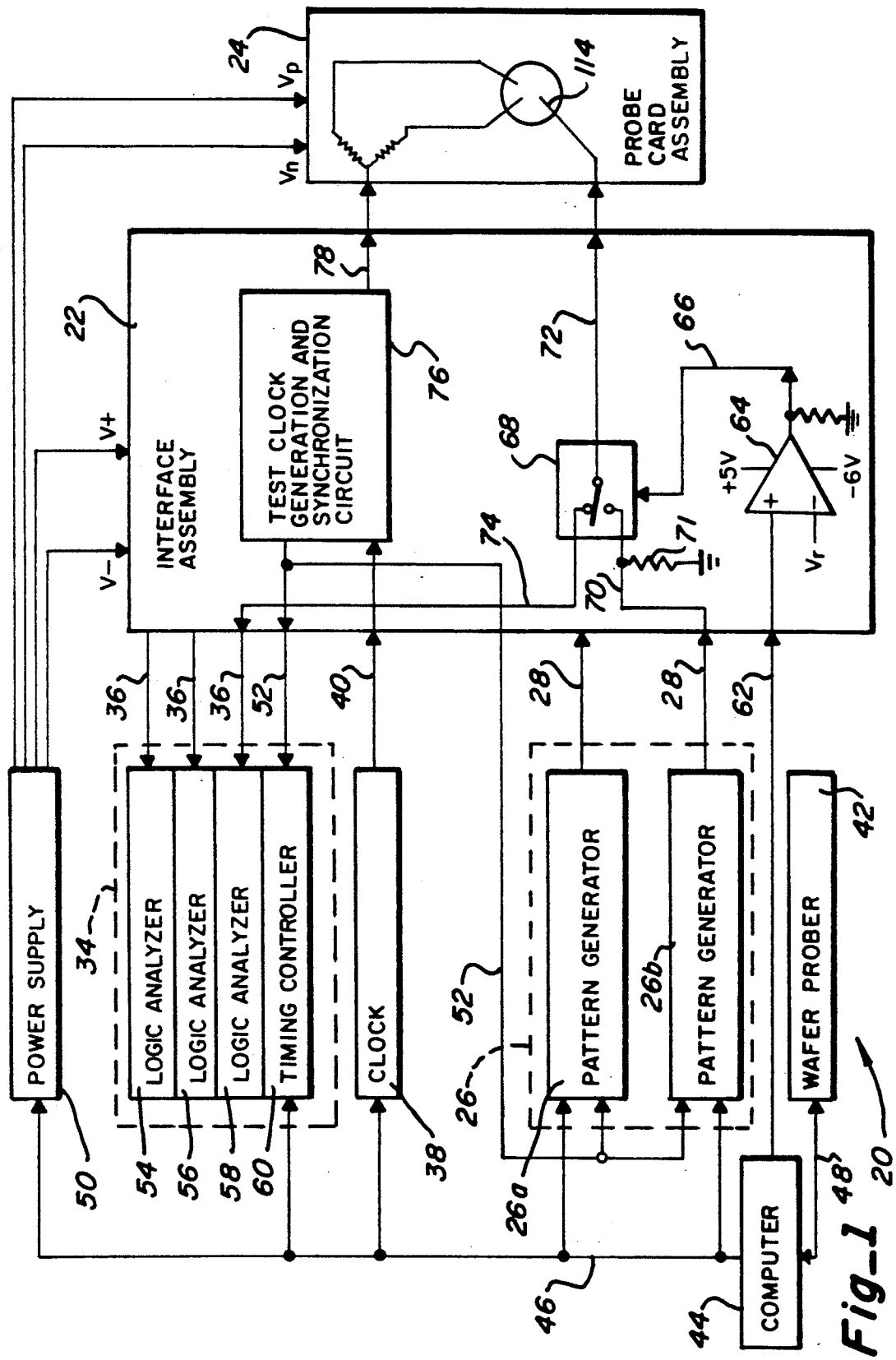
Fig_1

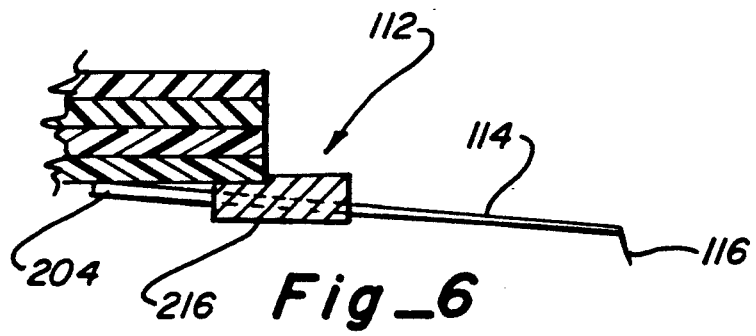
Fig_6
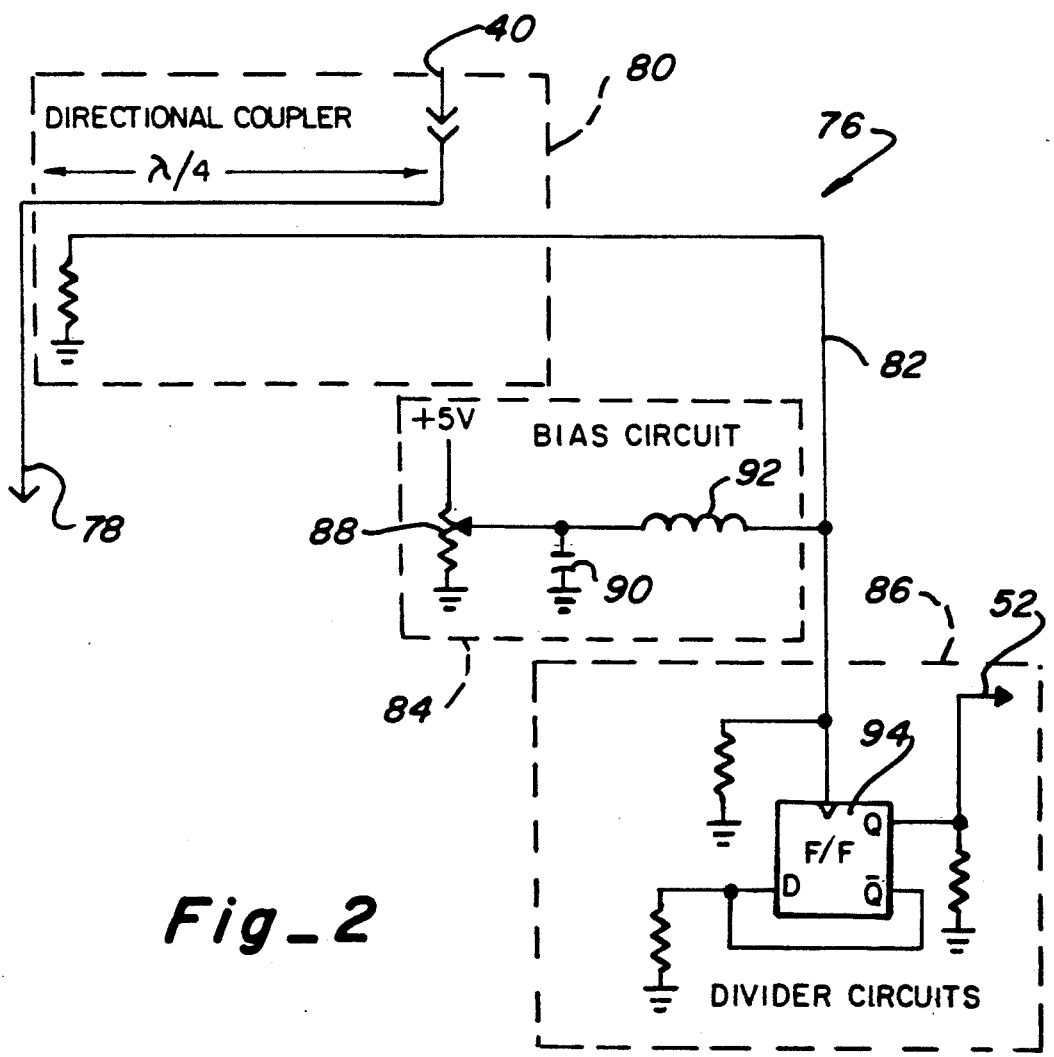
Fig_2

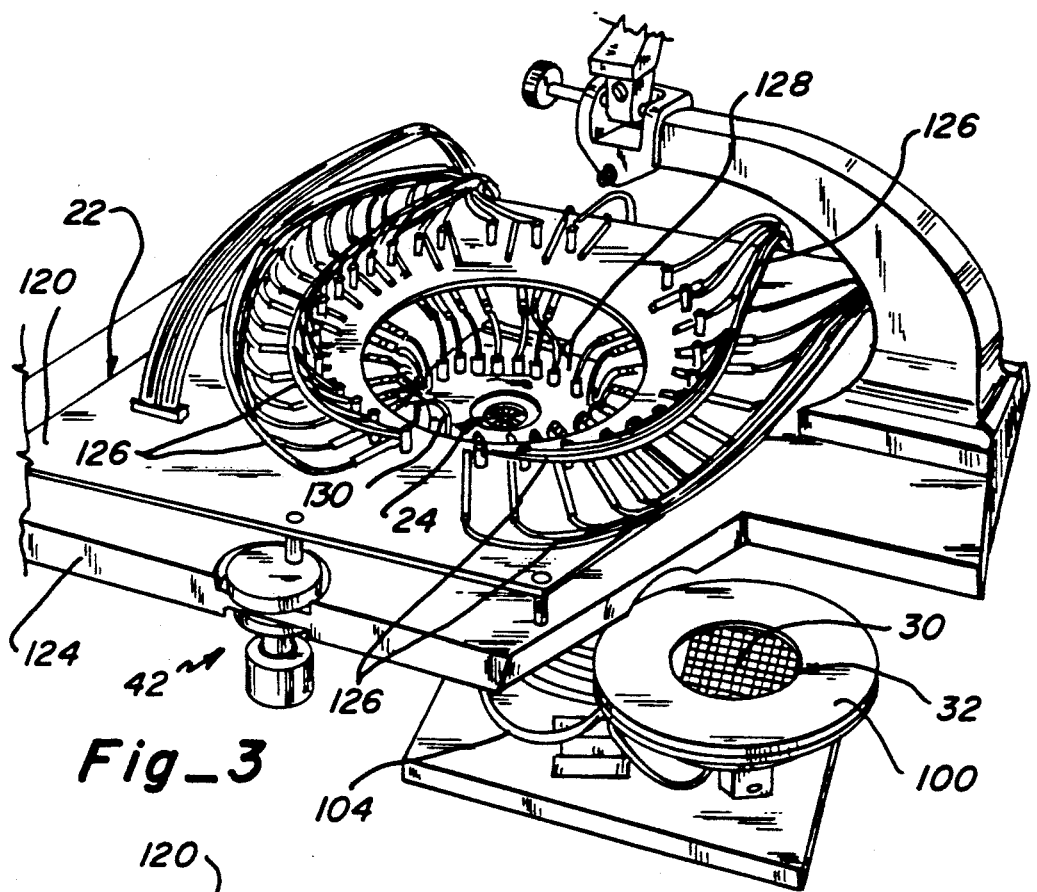
Fig_3
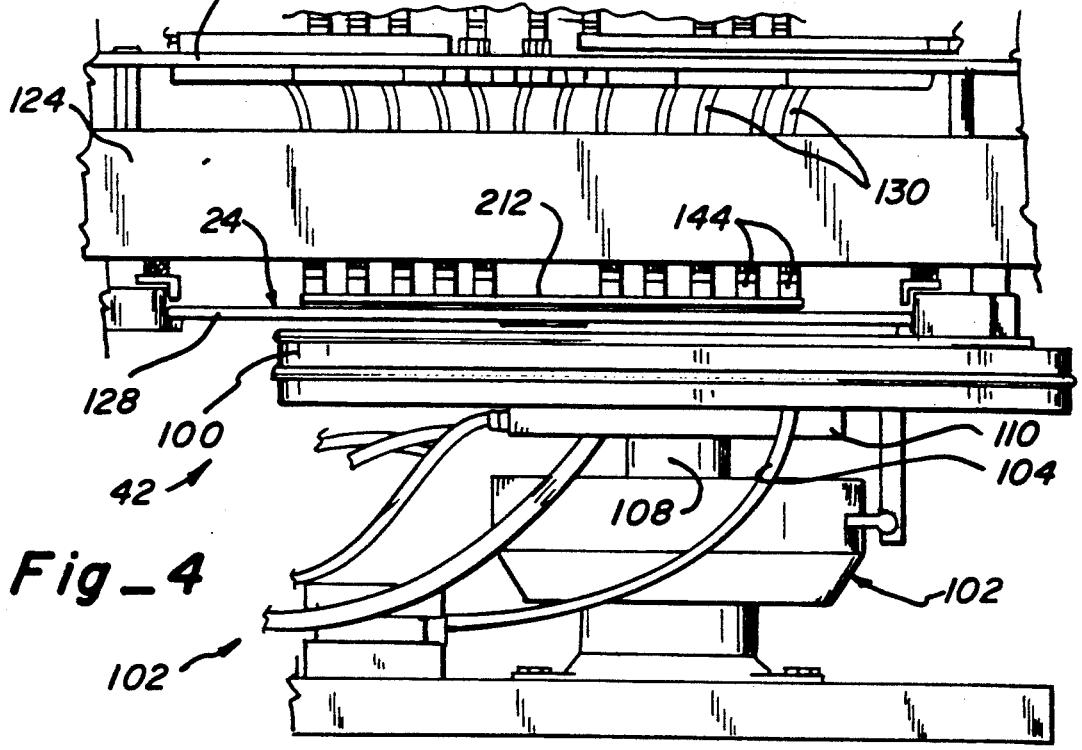
Fig_4

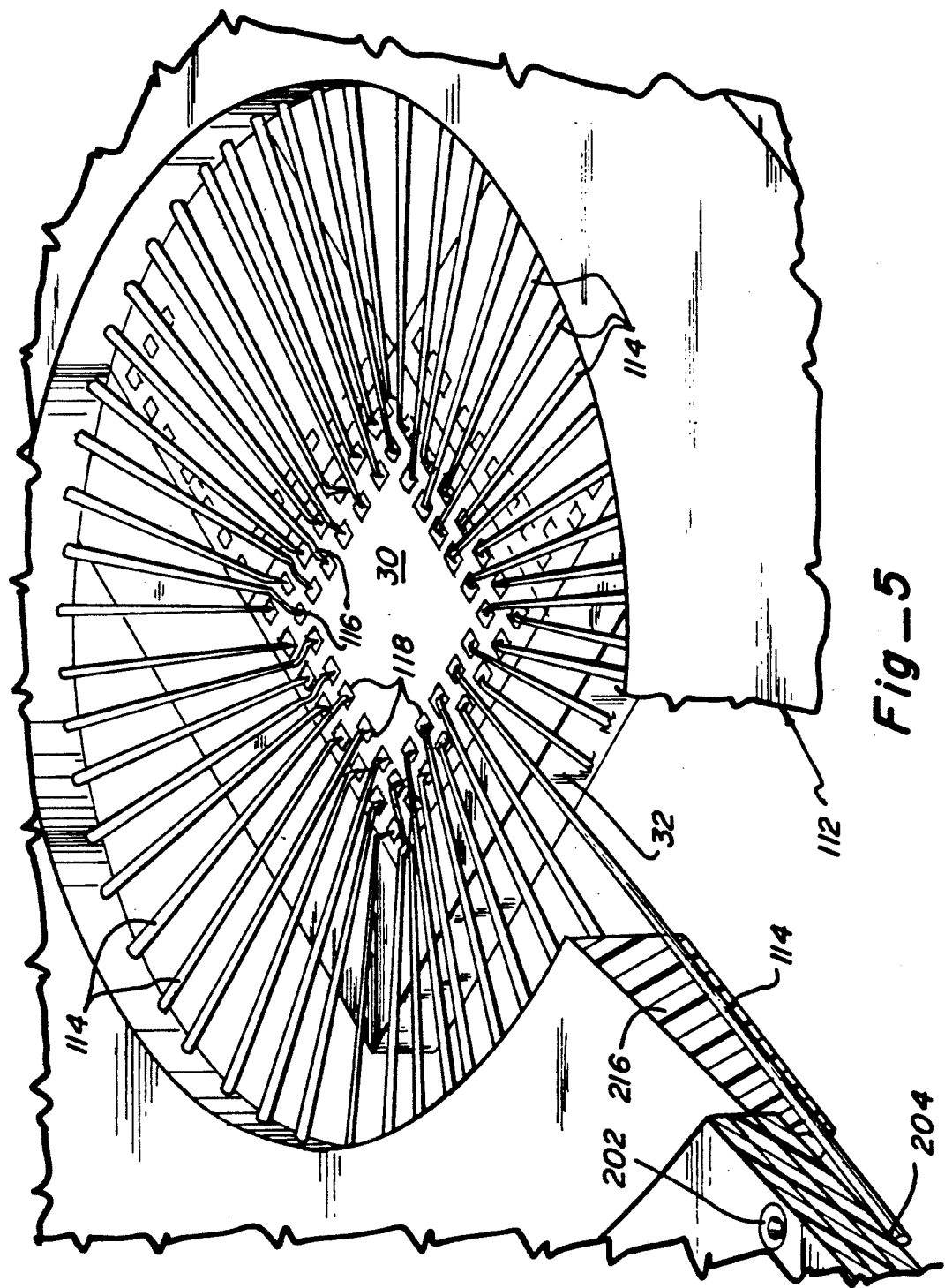
Fig_5

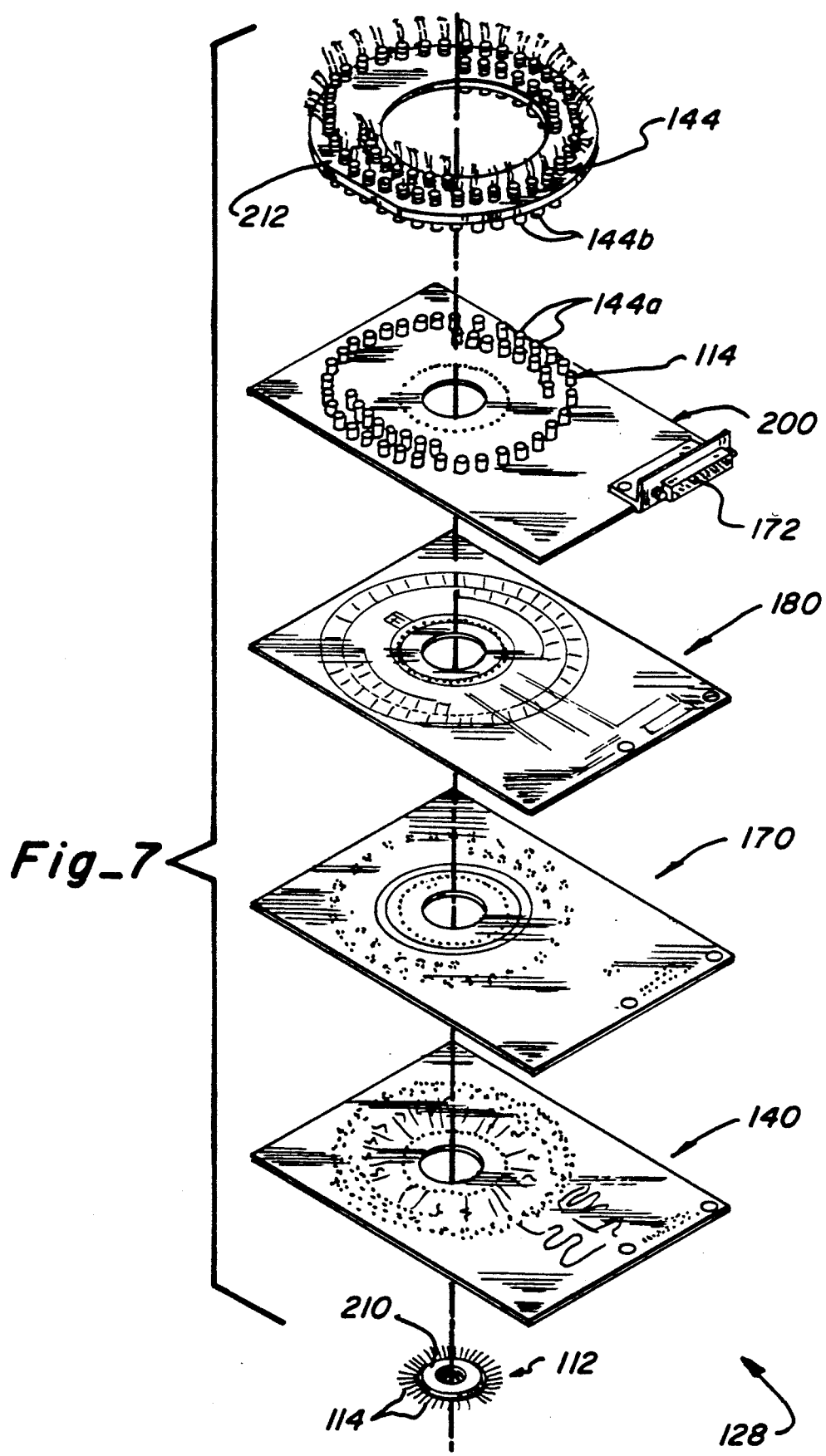
Fig_7

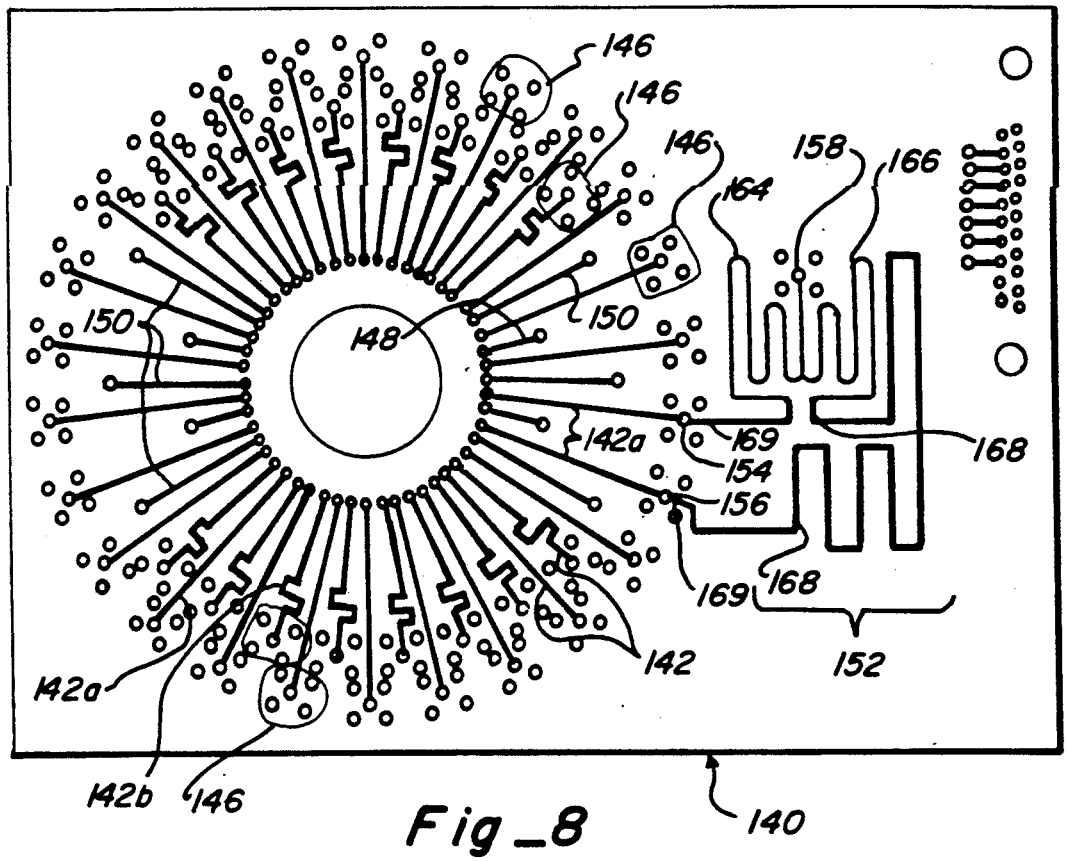
Fig_8
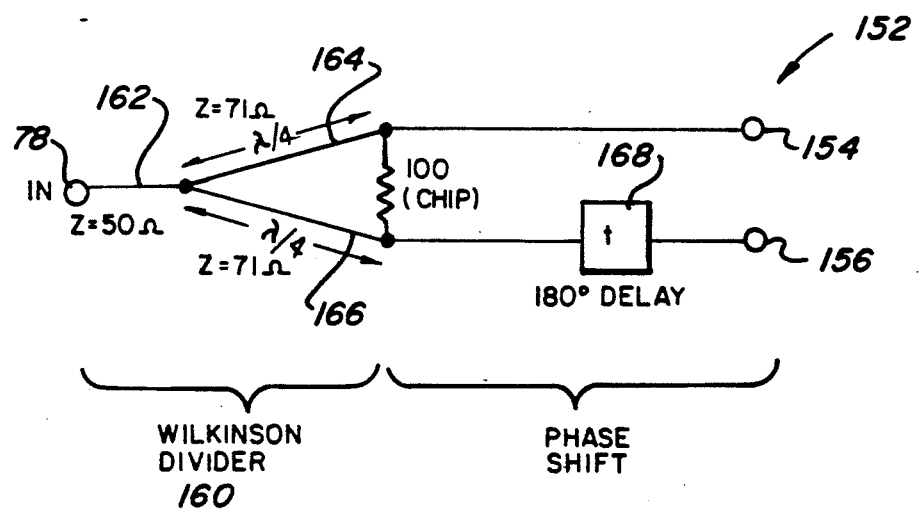
Fig_9

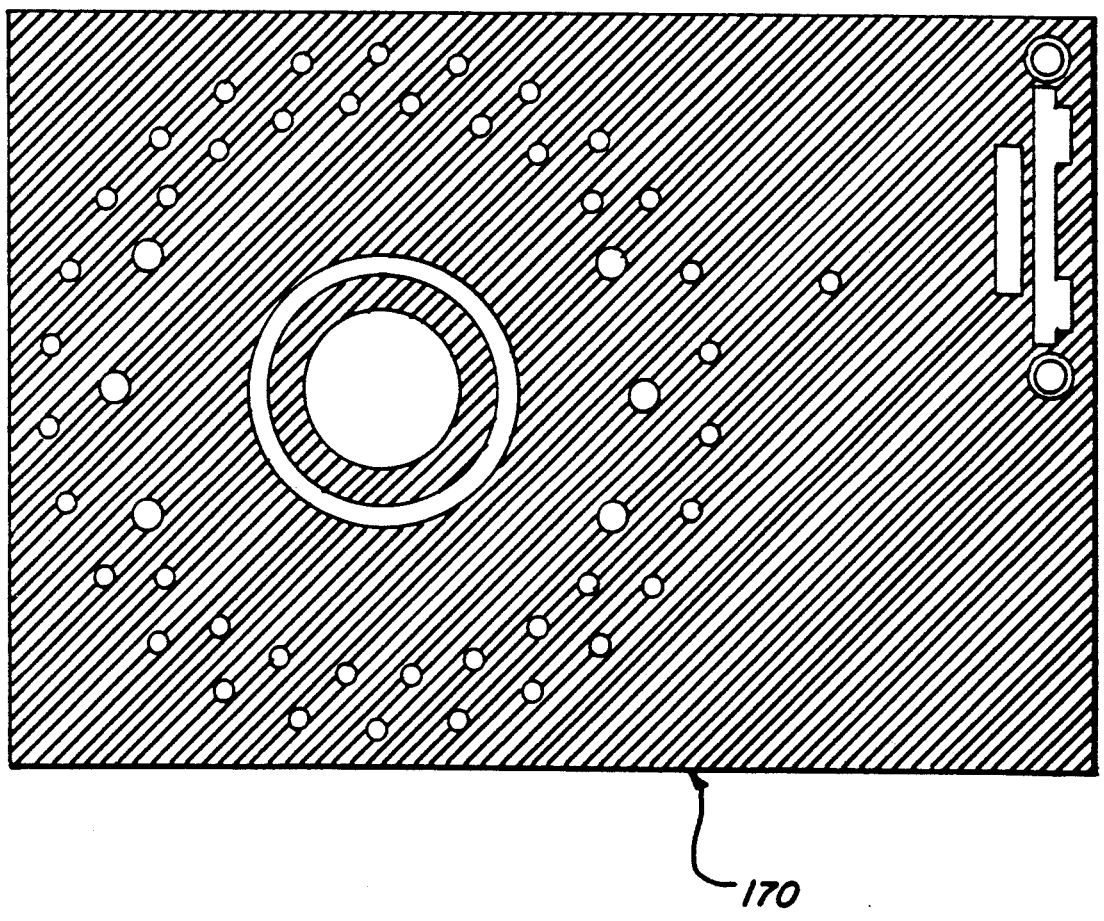
Fig_10

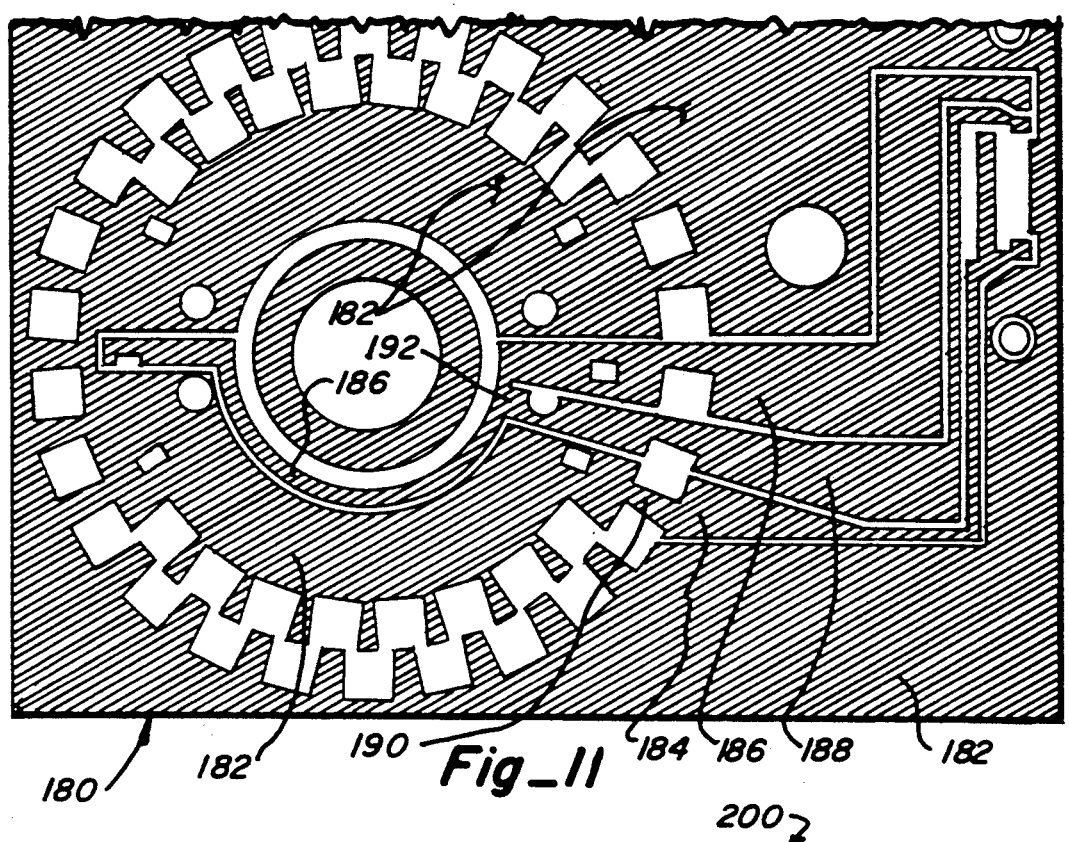
Fig_11
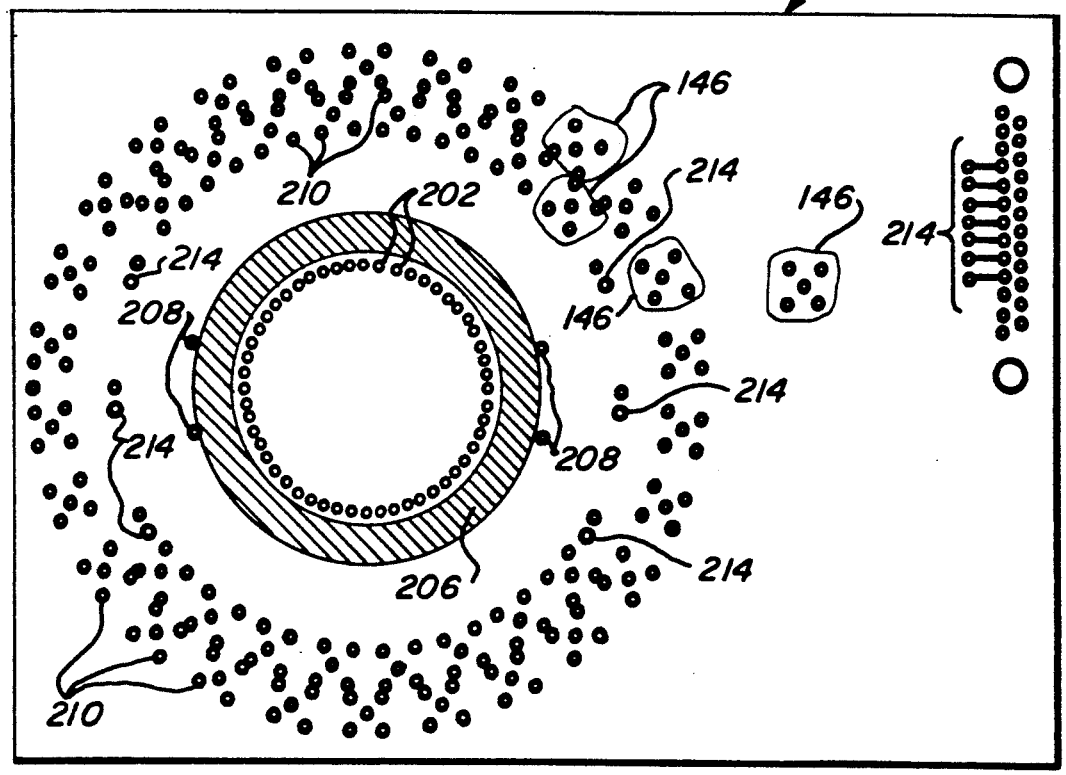
Fig_12

FUNCTIONAL AT SPEED TEST SYSTEM FOR INTEGRATED CIRCUITS ON UNDICED WAFERS

This invention relates to testing integrated circuits (ICs). More particularly, the present invention relates to testing ICs at their functional speed prior to cutting or dicing the ICs from the wafer upon which the ICs are fabricated and prior to packaging or assembling the ICs.

BACKGROUND OF THE INVENTION

In modern computer and digital processing technology, there is a continual demand for increases in system performance. Increased system performance may be obtained by increased switching speeds, faster clocking rates and higher computational capacities, among other things. Increases in system performance are also realized by greater component packaging and assembly densities and shorter signal conductive paths. Greater densities and shorter conductive paths reduce the length of the paths over which the signals travel and thereby reduce the time consumed in signal propagation between components.

Greater packaging and assembly densities in assembled systems or subsystems increase the inaccessibility of the components for repair or fault testing. Considerable difficulty and expense can be encountered when attempting to locate faulty circuits and components in assembled systems and subsystems. This is particularly the case where systems and subsystems are assembled from non-standard components as opposed to pre-packaged and pre-tested components. As a consequence, tests have been developed for testing the ICs at the die (IC chip) level before the ICs have been cut from the wafer upon which they are fabricated and before the ICs are packaged or assembled into systems or subsystems. Identifying the faulty ICs at the die level saves the expense of packaging the defective ICs and the expense of assembling systems and subsystems from defective ICs. Two basic types of IC tests have been developed to identify faulty ICs at the die level.

One typical IC test is a continuity test wherein electrical signal paths are tested for continuity. Many times, such tests fail to reveal faults or defects which manifest themselves only during operation of the system. Furthermore, continuity tests do not fully test the operational capabilities of the ICs, and those faults which are revealed during functional operation are not usually revealed by continuity tests. However, continuity tests are usually quicker to perform and are performed by lower cost test equipment.

Another type of IC test is a functional test. A functional test assesses the actual operation of the IC in question. Functional tests generally provide a better, more reliable indication of the condition of the IC, than is available from a continuity test. One of the disadvantages of functional tests is that full functional tests may require a considerable amount of time to accomplish the many different permutations of the functional features of an IC. Consequently, only selected functional features are tested while other functional features are not tested. Another concern with functional testers is that their operational speed may not match the functional speed of the IC in the assembled system. For example, the ICs in complex high speed computers may be required to operate or switch at speeds or rates of hundreds of millions of times per second. However at these high switching speeds, most currently available functional test equipment is incapable of supplying reliable signals to the IC and/or is incapable of detecting and measuring the signals delivered from the IC. Degradation in signal integrity and signal propagation occurs at such high speeds during testing but would not occur when the IC is assembled into the overall system where signal integrity and propagation is more controllable. Consequently, most current functional test equipment does not test ICs at their intended operating rate, but instead, tests the ICs at a slower switching speed.

The advent of gallium arsenide (GaAs) semiconductor ICs has dramatically increased the functional speed at which signals can be switched and propagated. Unlike slower speed silicon semiconductors, GaAs ICs commonly exhibit functional failures that appear only at the higher switching or clocking speeds. However at lower speeds, the same GaAs ICs may appear acceptably functional. The functional failures that appear at higher switching speeds are often due to substrate effects that cause duty cycle problems. As a result, low voltage states may not be achieved fast enough for proper functionality at high switching speeds, for example at 500 MHz, even though adequate functionality can be achieved at lower switching speeds, for example at 250 MHz.

Other problems relating to testing GaAs ICs at the chip or die level relate to making adequate electrical contact with the very small contact pads on the die, and maintaining the integrity of the signals applied to and received from the die in order to determine whether it is adequately functional. Much of the signal generation and signal analysis occurs in test system components which are spaced a considerable distance from the die, thereby requiring that the signals obtained from the die be routed efficiently and to avoid or prevent intervening signal degradation.

Thus, there is a unique need for a very high speed functional test system which is capable of detecting IC failures at extremely high switching speeds such as those prevalent in GaAs ICs. Inherent requirements of such a very high speed functional test system are the ability to maintain close control over the propagation of the generated and acquired test signals, and the ability to synchronize the signal generation and acquisition equipment of the test system to measure the necessary timing considerations at the higher speeds and thereby measure the sufficiency of the performance characteristics of the die.

SUMMARY OF THE INVENTION

In view of these and other considerations, the present invention of a digital test system for functionally testing undiced ICs or dies on wafers at relatively high test frequencies, has resulted. The system includes generator means for generating input signals to be applied to the die under test (DUT) and analyzer means for analyzing response signals supplied by the DUT in response to the input signals to thereby determine if the DUT is functioning properly. The DUT includes a plurality of contact pads arranged in a predetermined configuration to which the input signals are applied and from which the response signals are obtained. The system further includes a probe card assembly and an interface means in which many of the improvements of the present invention reside.

The probe card assembly includes a plurality of printed circuit boards laminated together as a single laminated structure. Printed circuit patterns are formed on the boards using conventional printed circuit techniques. A first one of the circuit patterns includes a plurality of equal length and equal impedance elongated micro strip test signal traces, and a second one of the circuit patterns includes a relatively large ground plane which extends substantially over the test signal traces and is separated from the test signal traces by the thickness of one of the boards to establish a uniform impedance for the test signal traces. A third circuit pattern includes a power plane of a size approximately equal to the size of the reference plane. A probe ring is attached to the laminated structure by a mounting ring. The probe ring has a plurality of resilient probes retained by a circular mounting ring in a pattern in which tips at the distal ends of the probes are positioned to physically and electrically contact the contact pads of the DUT when a wafer prober moves the wafer into the proper position. The other end of a majority of the probes at the mounting ring is electrically connected to the ends of test signal traces, and the other end of each of the remaining probes is connected to at least one of the power planes and the reference planes. High frequency connectors are attached to the laminated structure in electrical contact with the test signal traces of the first circuit pattern to conduct the input signals to and the output response signals from the probe card assembly.

The interface means electrically conducts the input signals from the generator means to the probe card assembly and electrically conducts the response signals from the probe card assembly to the analyzer means. The interface means includes a plurality of coaxial cables connected to the high frequency connectors attached to the probe card assembly. Preferably the interface means also includes a plurality of selection switch means by which to selectively alternatively connect the input signals from the generator means to the DUT or to transmit the output response signal from the DUT to the analyzer means. The interface means also preferably includes a test clock generation and synchronization circuit which derives and supplies the necessary signals for clocking the synchronization of the generator and analyzer means and for clocking the application of the input and output signals to the DUT. Preferably, the interface means comprises an interface card formed by a plurality of printed circuit boards laminated together as a single laminated structure. The printed circuit boards include printed circuit patterns formed thereon, which include conventional printed circuit components and micro strip traces to provide the components of the interface means.

Forming the circuit elements of both the probe card assembly and the interface card as printed circuit micro strips using printed circuit techniques assures a high degree of signal integrity, of control over the signals at very high test frequencies, and of efficiency in signal path routing. Arranging the probe ring on the laminated structure achieves good contact between the probe tips and the DUT contact pads. Many other desireable features and improvements result.

A more complete understanding and appreciation of the present invention can be obtained by reference to the accompanying drawings, which are briefly described below, and from the following detailed description of a presently preferred embodiment, and from the appended claims.

BRIEF DESCRIPTION OF THE DRAWINGS

FIG. 1 is a block diagram of the functional at speed test system for ICs on undiced wafers according to the present invention.

FIG. 2 is a schematic diagram of a test clock generation and synchronization circuit of the interface assembly shown in FIG. 1.

FIG. 3 is a partial perspective view of a wafer prober including an undiced wafer containing ICs to be tested, an interface assembly and a high frequency probe card assembly of the system shown in FIG. 1.

FIG. 4 is an enlarged side elevational view of a portion of the wafer prober shown in FIG. 3.

FIG. 5 is an enlarged perspective view, having a portion broken out, illustrating a plurality of probes of a probe ring of the probe card assembly shown in FIGS. 3 and 4, in contact with contact pads of a die undergoing a functional test.

FIG. 6 is a cross sectional view of a portion of the probe card assembly shown in FIG. 5, illustrating the probe ring.

FIG. 7 is an exploded view of four separate layers of printed circuit patterns, a high frequency connector bulkhead and the probe ring of a multilayer high frequency probe card assembly shown in FIGS. 1, 3, 4 and 5.

FIG. 8 is a plan view of the circuit traces formed as a first layer circuit pattern of the probe card assembly shown in FIG. 7.

FIG. 9 is a circuit diagram of a divider and phase shift circuit formed by some of the circuit traces of the first layer circuit pattern of the probe card assembly shown in FIG. 8.

FIG. 10 is a plan view of a ground plane formed by a second layer circuit pattern of the probe card assembly shown in FIG. 7.

FIG. 11 is a plan view of power planes and voltage sensing conductors formed by a third layer circuit pattern of the probe card assembly shown in FIG. 7.

FIG. 12 is a plan view of the circuit traces formed as a fourth layer circuit pattern of the probe card assembly shown in FIG. 7.

DETAILED DESCRIPTION

A presently preferred embodiment of a functional at speed test system 20 for ICs is illustrated in FIG. 1. Although the system 20 is intended for testing ICs on undiced wafers, it can also be employed to test diced ICs as well as packaged ICs with appropriate modifications.

The primary components of the system 20 include an interface means or assembly 22; a high frequency probe card assembly 24; a test signal generator means 26 for generating input signals 28 which are applied through the interface assembly 22 and the probe card assembly 24 to an IC die undergoing test (DUT) 30 (FIG. 5) of an undiced wafer 32 (FIG. 3); a response signal analyzing means 34 for analyzing response signals 36 that have been supplied by the DUT in response to the input signals 28 and conducted through the probe card assembly 24 and the interface assembly 22; clock means 38 for supplying system clock signals 40 which control the operation of the interface assembly 22 and the probe card 24 and synchronize the relative timing of the delivery of the input signals 28 and the receipt of the response signals 36; a wafer prober 42 for manipulating the wafer 32 (FIGS. 3 and 4) and positioning the DUT in the proper position relative to the probe card 24 to establish the electrical connection with the contact pads of the DUT to conduct the test; and a control computer 44. The control computer 44 supplies control signals 46 to control the functionality of the input signal generator means 26, the response signal analyzing means 34, and the clock 36. The control computer 44 also supplies signals 48 to control the wafer prober 42 and the wafer prober 42 supplies signals 48 to the computer 44 representative of the position of the DUT to obtain proper positioning of the DUT for the test.

The system 20 also includes a power supply 50 which supplies positive and negative electrical power to the interface assembly 22 and the probe card assembly 24, in response to the control signals 46 from the computer 44. The power from the supply 50 energizes the elements of the interface and probe card assemblies and energizes the DUT so that it will function to deliver output response signals 36 in response to the input signals 28 applied thereto.

The input signal generator means 26 includes at least one conventional vector or word pattern generator. Although a pair of pattern generators 26a and 26b are illustrated, the number of generators is selected to produce a sufficient number of input signals 28, known as vectors or word patterns, for fully testing the DUT. Of course, the number of input signals 28 are selected to be appropriate for the types of functional tests conducted on the DUT. The input signals 28 and sequence of the individual functional tests are controlled by the computer 44 through the control signals 46 delivered to the pattern generators 26a and 26b. A clock signal 52 is supplied from the interface assembly 22 to clock the word pattern generators 26a and 26b to supply the input signals 28 at predetermined times. The pattern generators are conventional high speed components such as model PG232 or PG1000 pattern generators manufactured by Outlook Technology of Campbell, Calif., U.S.A.

The analyzer means 34 includes at least one logic analyzer. A plurality of conventional logic analyzers 54, 56 and 58 are shown. The number of logic analyzers used depends on the number of signals which each is capable of receiving and analyzing and the number of output response signals supplied by the DUT in response to the input signals 28. The logic analyzers 54, 56 and 58 capture the response signals 36, and analyze those response signals to determine if the DUT is properly functioning or defective. Each of the logic analyzers 54, 56 and 58 is controlled by a timing controller 60. The timing controller 60 enables each logic analyzer to accept the response signal 36 applied to it when clocked by the clock signal 52. In order to capture the response signals 36 within an appropriate time window or relationship relative to the delivery of the input signals 28, and thereby achieve appropriate timing synchronization between the input signals 28 and the response signals 36, the same clock signal 52 is supplied to the timing controller 60 from the interface assembly 22 as is supplied to the pattern generators 26a and 26b. The use of the same clock signal 52 assures the necessary synchronization of the pattern generators and the logic analyzers to obtain high speed operation. The logic analyzers are conventional high speed components such as model T100AW logic analyzers manufactured by Outlook Technology of Campbell, Calif., U.S.A.

The computer 44 is a conventional microprocessor computer which is programmed to achieve the functionality described herein. The computer 44 supplies the control signals 46 and the control and position signals 48 over busses such as an IEEE 488 bus.

In most regards, the generator means 26, the analyzer means 34 and the computer 44 are conventional, and their functionality is readily comprehended by those skilled in the art from this description. However, the features of the interface assembly 22 and the probe card assembly 24 obtain the improved performance available by the functional at speed test system 20 of the present invention.

Two important functions performed by the interface assembly 22 are to generate the clock signal 52 for the synchronization of the pattern generators 26a and 26b and the logic analyzers 54, 56 and 58, and to selectively connect an input signal from the pattern generators to the DUT or alternatively to selectively connect each response signal from the DUT to a logic analyzer. The selective and automatic connection capability provides automatic input/output (I/O) selection, thereby achieving the capability to functionally test many different types of ICs with the present system. Since different ICs receive input signals and supply output signals at different contact pads, the automatic I/O selection allows the input and response signals to be selectively routed for each different DUT. To achieve this fully automatic testing capability, the test system 20 must automatically reconfigure the electrical connection of the probes which physically and electrically contact the DUT contact pads. Thus the particular probes which are supplying input signals to the DUT, and those particular probes which are receiving the response signals from the DUT, must be changed in accordance with the DUT type being tested.

In relatively lower speed test systems, automatic reconfiguration is usually accomplished by one of two techniques. One technique requires a uniquely wired DUT interface fixture for each DUT type, thereby requiring the DUT interface fixture to be manually changed each time a different DUT is tested. The second technique requires a tri-stateable signal generator and signal acquisition device for each DUT contact pad. The generator and acquisition device are electrically connected by separate signal traces branching from a single junction. A conductor extends from the junction to the contact pad of the DUT. When a DUT output signal is supplied to the acquisition device, the tri-stateable generator is in the high impedance condition, thereby providing a lower impedance path through the branch to the acquisition device. It has been discovered, however, that terminating the branch to the tri-stateable generator in a high impedance causes reflections at high frequencies. The reflections either add to or subtract from the proper DUT output signal at the junction point, thereby modifying the signal obtained by the acquisition device. The modifying effect of the reflected signal may cause erroneous test results. It has therefore been discovered that the DUT input and output response signals should traverse only one signal path which is properly terminated in relation to the signal source itself. This improvement, among others, is provided by the interface assembly 22.

A selection switch means 68 performs the selective alternative I/O switching functions to allow automatic testing capability for different ICs. In each of its two conditions, only a single, un-branched signal path extends between the DUT and one of the test signal generator means 26 or the response signal analyzing means 34. Selection signals 62 are supplied from the computer 44 to a switch control means such as a conventional comparator 64. The comparator 64 changes state relative to a reference voltage Vr and thereby shifts the TTL level selection signals 62 from the computer 44 to a switch control signal 66 of an appropriate level to control the selection switch 68. The selection switch 68 is preferably a conventional 4 GHz GaAs switch. A conductor 70 carries an input signal 28 from one pattern generator to the selection switch 68. A resistor 71 terminates the conductor 70 at the switch 68 to provide the proper termination voltage for proper operation. An interconnecting conductor 72 extends to the probe card assembly 24 for conducting the input signal to the DUT or for conducting the output response signal from the DUT. A conductor 74 is connected to the selection switch 68 and carries the response signal from the interconnecting conductor 72 to a logic analyzer 54, 56 or 58. The switch control signal 66 controls the selection switch 68 to selectively establish one of these two alternative connections through the selection switch 68. One individual selection switch 68 and comparator 64 is provided for each of the signal paths to and from the DUT, although only one of each is shown in FIG. 1 for illustration purposes. Similarly, each individual selection switch 68 is connected by conductors 70 and 74 to one pattern generator and to one logic analyzer, in order to selectively either deliver an input signal from a pattern generator to the conductor 72 or to conduct a response signal from the conductor 72 to a logic analyzer.

The clock 38 is a conventional reference source clock, but it may be controlled by control signals 46 supplied from the computer 44 to operate in a burst mode or in a free running mode. The clock 38 supplies the system clock signals 40 to a test clock generation and synchronization circuit 76 of the interface assembly 22. The circuit 76 supplies the clock signal 52 to the pattern generators 26a and 26b and to the timing controller 60 associated with the logic analyzers 54, 56 and 58. The circuit 76 also responds to the clock signal 40 and supplies a high frequency test clock signal 78 to the probe card assembly 24. By deriving the signals 52 and 78 from and in relation to a single system clock signal 40, the operation of the system 20 is maintained in better synchronization.

Details of the clock generation and synchronization circuit 76 are shown in FIG. 2. The circuit 76 functions in response to the system clock signal 40, for example, a 500 MHz sine wave signal, supplied from the clock 38 (FIG. 1), and produces the clock signal 52, for example, a 250 MHz zero degree phase locked digital signal. The clock signal 52 insures that the data bit signals acquired by the analyzers 54, 56 and 58 are acquired at a precisely controlled time interval relative to the data bit signals produced by the pattern generators 26a and 26b. At the relatively high frequencies at which the DUT is tested, very small changes in relative timing can cause the input signals 28 to the DUT to appear at the wrong time or output response signals from the DUT to be sampled at the wrong time. Since the DUT output response signals are automatically compared to a previously stored good signal pattern in the logic analyzers, relative timing problems could cause erroneous test results.

The typical method of creating synchronized signals is to use phase locked loops. Phase locked loops require a relatively large number of active components, which could introduce some amount of phase uncertainty. Phase locked loops also require a continuous regularly-occurring input clock signal, which usually prevents the use of phase locked loops in applications where the clock signal is a finite length burst of pulses. The use of a finite length burst of pulses during IC testing is typical, thereby making phase locked loops difficult to employ in IC test systems such as the present system where input signals to the DUT may be a finite length burst of pulses.

As is shown in FIG. 2, the clock signal 40 passes through a quarter wavelength, micro strip directional coupler 80. After passing through the directional coupler 80, the signal is supplied as the high frequency test clock signal 78 to probe card assembly 24 (FIG. 1). A resulting coupled port signal 82 is obtained and is supplied to a bias circuit 84 and a high speed divider circuit 86. The bias circuit 84 biases the signal 82 at a predetermined DC level which is approximately equal to the input threshold voltage of the divider circuit 86. The DC bias level of the signal 82 is established by a potentiometer 88, while a capacitor 90 and an inductor 92 isolate the high frequency component of signal 82 to allow addition of the DC level established by the potentiometer 88. The divider circuit 86 includes a high frequency flip flop 94 which divides the frequency of the signal 82 by two. By biasing the signal 82 at the DC level which is approximately equal to the trigger threshold level of the flip flop 94, the alternating potential of the signal 82 will directly trigger the flip flop 94. The output signal of the flip flop 94 is the clock signal 52, which in this case of a 500 MHz signal at 82, occurs at 250 MHz.

Because the circuit 76 performs digital frequency division in deriving the clock signal 52, unlike phase locking two independent clock sources, only two cycles of clock signal 40 are needed to produce one cycle of the output clock signal 52. Consequently, a burst of clock signals from the clock 38 will still maintain synchronization of the system 20. Furthermore, since the clock signal 52 and the test clock signal 78 are derived from the single master clock signal 40 by using only one active component (the flip flop 94), phasing is relatively easily controlled.

The wafer prober 42 is better understood by reference to FIGS. 3, 4 and 5. The prober 42 includes a lower moveable platform 100 upon which the wafer 32 is positioned. The wafer 32 contains the undiced ICs which are to be tested (DUTs 30). The platform 100 is connected to the prober 42 by a controllable positioning apparatus 102. The positioning apparatus 102 includes means for holding the wafer 32 on the platform 100, usually by the application of a vacuum to the back side of the wafer from a vacuum hose 104. The positioning apparatus 102 also includes a fluid motor 108 for moving the platform 100 in a vertical plane, and another fluid motor 110 for rotating the platform 100. In addition the platform is moveable laterally to allow the wafer 32 to be placed on the platform 100. Thus the wafer prober 42 is capable of the necessary positional movements to properly locate an IC for testing.

The positioning apparatus 102 moves in response to control signals 48 from the computer 44 (FIG. 1) to position one DUT 30 at a time in the appropriate location for testing. The wafer prober 42 also generates and sends back, to the computer 44, position signals 48 (FIG. 1) to assure proper positioning of the DUT 30 for testing and to allow the computer 44 to designate in memory those ICs on the wafer 32 which are properly functional and those which are faulty. By distinguishing the good ICs from the bad ICs, the good ICs can be automatically sorted from the wafer by conventional equipment after the wafer 32 is diced.

The manner by which each IC is tested, after having been positioned properly by movement of the platform 100, is illustrated in FIG. 5. A probe ring 112 is a part of probe card assembly 24 (FIG. 1), and the probe card assembly 24 is attached to the wafer prober 42 (FIG. 3). The probe ring 112 includes a plurality of probes 114, each of which extends to a distal end probe tip 116. The probe tips are positioned at the appropriate location to contact pads 118 formed on the DUT 30. By movement of the platform 100, each of the contact pads 118 is aligned with the probe tips 116 of the probe ring 112. The platform 100 is raised upward and the probe tips 116 make physical and electrical contact with the contact pads 118. The amount of upward movement is sufficient to deflect or "overdrive" each of the probes 114 a slight amount, thereby insuring a slight mechanical bias force for maintaining an effective electrical contact of the probe tips 116 and the contact pads 118 during testing of the DUT 30. A probe ring similar to that described herein is available commercially from Alphatronics Engineering of Colorado Springs, Colo., U.S.A.

The input signals 28 from the pattern generators 26a and 26b are supplied through the interface assembly 22 (FIG. 1) to some of the probes 114 and conducted through the probe tips 116 to the contact pads 118 and into the DUT 30. The output response signals 36 created by the DUT 30 in response to the input signals are conducted from the contact pads 118 to the probe tips 116 through the probes 114 and ultimately to the logic analyzers 54, 56 and 58 (FIG. 1). Positive and negative sources of power and reference potential are also supplied to the DUT 30 through the probes 114.

If desired and the appropriate analog DC signals are generated and analyzed, analog DC voltages are applied to the contact pads 118 and the current from other contact pads is measured in response thereto to calculate the DC input and output impedances through the contact pads to which the probe tips are connected. Measuring the DC input and output impedances is used to determine if the IC meets parametric conditions.

The interface assembly 22 preferably takes the form of an interface card 120, shown in FIGS. 3 and 4. The interface card 120 is preferably formed by laminating a plurality of printed circuit boards together in a single laminated structure. Upon each printed circuit board there are mounted or formed the packaged microwave components, hybrid microwave modules, micro strip circuit traces and analog integrated circuits, to accomplish the functions previously described in conjunction with the test clock generation and synchronization circuit 76, the selection switches 68 and the comparators 64 (FIG. 1). Many of the components included in the interface card 120 are GaAs ICs, in order to enable the high switching rates required to test each DUT at its functional capability. All of the high frequency traces on the interface card 120 are micro strips in order to achieve the necessary signal integrity at high frequencies. The test clock generation and synchronization circuit 76 (FIG. 1) is preferably fabricated on a single printed circuit board of the interface card 120, in order to more easily maintain the synchronization of the clock and test clock signals.

The interface card 120 is connected to the upper side of a frame member 124 of the wafer prober 42, as shown in FIGS. 3 and 4. The conductors 70 and 74 (FIG. 1), which extend from the pattern generators and the logic analyzers to conduct the input signals 28 and the output response signals 52, respectively, preferably include coaxial cables 126, shown in FIG. 3.

The probe card assembly 24 preferably takes the form of a high frequency probe card 128, as shown in FIGS. 3, 4 and 7. Coaxial cables 130 conduct signals between the interface card 120 and the high frequency probe card 128. The high frequency test clock signal 78 (FIG. 1) is conducted from the interface card 120 to the to the high frequency probe card 128 over one of the coaxial cables 130. The interconnecting conductors 72 from the selection switches 68 (FIG. 1) to the probes 114 (FIG. 4) include the coaxial cables 130. The high frequency probe card 128 is connected to the lower side of the frame member 124 of the wafer prober 42, as shown in FIG. 4. The improvements available from the high frequency probe card 128 are understood by reference to FIGS. 6 and 7.

The high frequency probe card 128 is preferably constructed of multiple printed circuit boards laminated together as a single structure. The laminated structure is sufficiently thick that it will not flex during normal overdrive conditions when the DUT is brought into contact with the tips 116 of the probes 114 of the probe ring 112 (FIG. 5). Consequently, the probes 114 to maintain good electrical contact between the probe tips 116 and the contact pads 118 of the DUT 30, without moving out of contact with the contact pads due to excessive flexibility of the probe card 128. Such electrical contact establishes and maintains good signal quality at very high test frequencies, among other things.

Preferably, the high frequency probe card 128 is formed by laminating three FR-4 printed circuit boards, as shown in FIG. 6. Four layers of circuit patterns on the three laminated boards are thus obtained. The four layers of circuit patterns are shown in FIG. 6.

The first layer circuit pattern 140, shown in FIGS. 7 and 8, contains a plurality of 50 ohm constant phase shift micro strip traces 142a and 142b to interconnect the probes 114 of the probe ring 112 (FIG. 5) to high frequency connectors, which are conventional SMB connectors 144 in the preferred embodiment, (FIG. 4) to which the coaxial cables 130 from the interface card 120 (FIG. 3) are connected. The length of all of the traces 142a and 142b is equal to minimize the signal phase shift between any two I/O connections through the probes to the contact pads. The micro strip traces 142a are straight, while the micro strip traces 142b include an S shaped middle portion which creates the added length to equalize their length with the length of strips 142a. In the preferred embodiment, the phase shift between any two I/O connections is less than five picoseconds. Additional inner traces of unequal length, for example, 148 and 150, supply the ground reference and the positive and negative electrical power connections to the DUT, thereby energizing it for proper operation.

At the radially outer end of each of the traces 142a and 142b, a group 146 of five contact pads are located. The center contact pad of the group 146 connects to a through hole in the assembled high frequency probe card 128 for electrical connection to the center conductor of the coaxial cable 130 in the SMB connector 144 (FIG. 4). The housing of one mating portion of each SMB connector is mechanically connected to the assembled high frequency probe card 128 by insertion of connecting tabs of the SMB connector into holes formed into the four exterior pads surrounding the center contact pad of the group 146.

The circuit pattern traces on the first layer 140 also create a single-ended to differential-ended clock converter 152, as shown in FIGS. 8 and 9. The clock converter 152 receives the high frequency test clock signal 78 from the test clock generation and synchronization circuit 76 (FIGS. 1 and 2) at terminal 158 and generates true and complement test DUT clock signals at terminals 154 and 156, respectively, which are applied to the DUT 30 (FIG. 3). The clock converter 152 includes a modified Wilkinson divider 160. The test clock signal 78 is conducted down a single 50 ohm micro strip trace 162 where it encounters two 71 ohm quarter wavelength branches 164 and 166. Branch 166 is connected to a 180 degree phase delay network (at the frequency of the test clock signal 78), which is formed by an elongated micro strip trace 168 shown in FIG. 8. The terminals 154 and 156 connect to the micro strip traces 142a which in turn are connected to two probes 114. The result is that two equal power DUT clock signals are available at terminals 154 and 156, which are held very closely to 180 degrees out of phase at the frequency of the test clock signal 78, e.g., approximately 500 MHz.

A conventional Wilkinson divider would use termination resistors at the terminal ends of the branches 164 and 166. However, the clock converter 152 does not use such termination resistors, thereby allowing the resulting reflections to add to the primary signal available from the divider 160. The addition of the reflections creates approximately a 98 percent gain in the signal amplitude at the tips of the probes when in contact with a high impedance DUT input contact pad.

By incorporating the differential clock converter 152 in the first layer circuit pattern 140, the 180 degree phase relationship between the signals at terminals 154 and 156 is more readily maintained, compared to the prior technique where separate clock signals are conducted down relatively lengthy (for example two or three feet) coaxial cables. Over time, such prior art cables develop differing amounts of degradation, resulting in phase shifts between the differential DUT clock signals. Such phase shifts can be responsible for producing erroneous test results. Use of the single-ended to differential-ended clock converter 152 formed as traces on the high frequency probe card 128 avoids these problems and maintains the differential clock signals applied to the DUT at a very constant 180 degree phase shift, at approximately equal power, and at an increased amplitude due to the effective addition of the reflected signals to the primary signal.

If it is desirable to utilize an external differential clock source, rather than the on-board differential clock 152, an SMB connector may be provided at the location of the five contact pads at the terminals 154 and 156, as shown in FIG. 8. In such a situation, the signal delivered from the external clock is applied to the micro strip traces 142a leading to the probes from the SMB connector. When it is desired to use the on-board differential clock 152, a foil 169 or micro strip trace (shown in FIG. 8) extends between the ends of the terminals 154 and 156 and the center pads of the associated group of five pads to which the SMB connectors would otherwise be connected, thereby allowing the signals from the on-board differential clock converter 152 to be connected to the micro strip traces 142a.

A second layer circuit pattern 170 is shown in FIGS. 7 and 10. The second layer circuit pattern 170 provides almost a complete ground or reference plane for all of the micro strip traces of the first layer circuit pattern 140. The circuit pattern 170 covers almost all of the surfaces over which the micro strip traces of the first layer circuit pattern 140 cover, except that holes and spaces are provided in the second layer circuit pattern 170 where electrical connections between circuit patterns of other layers extend. The ground plane layer 170 provides a very good return path for the relatively high current, for example 500 milli-amps, that each DUT 30 may draw. The ground plane layer circuit pattern 170 is also of a size which provides a very low impedance path for supply return currents, to minimize the effect of signal switching transients. The circuit pattern 170 is connected to an external ground reference through multiple pins of a conventional 25 pin "D" power connector 172 (FIG. 7).

The separation between the circuit pattern layers 140 and 170 results from the thickness of the insulating substrate (FIG. 6) of one of the printed circuit boards of the high frequency probe card. This separation distance is adequate to provide sufficient separation between the micro traces of the first layer 140 and the ground plane of the second layer 170 to allow the micro strip traces of the first layer to be narrow enough for proper trace routing without inducing cross talk, while still providing a characteristic 50 ohm trace. The equation used for determining the width of the micro strip traces based on the thickness of the insulating layer between the trace and the ground plane is known microwave transmission theory. Maintaining the width of the micro strip traces in the conductor pattern of the first layer 140 narrow enough allows them to be directly routed to the points where the probes of the probe ring are soldered, avoiding the problem of unequal length traces which could induce phase changes with respect to the input and output signals of the DUT. Furthermore, the use of the 50 ohm traces minimizes any interconnect impedance discontinuities which might result. Minimizing impedance discontinuities minimizes signal reflections, which maximizes the signal quality delivered to and received from the DUT. It is also desirable that a gap between adjacent traces in the first layer circuit pattern be maintained at least twice the thickness of the dielectric of the insulating substrate between the traces and the ground plane, in order to minimize cross-coupling of the signals between adjacent micro strip traces.

A third layer circuit pattern 180 of the high frequency probe card is shown in FIGS. 7 and 11. The third layer circuit pattern 180 is divided into a positive voltage supply plane 182, a positive voltage supply sensing conductor 184, a negative voltage supply plane 186, and a negative voltage supply sensing conductor 188. In actuality, a single conductor forms the positive power supply plane 182 and the positive power supply sensing conductor 184, and another separate conductor forms the negative power supply plane 186 and the negative power sensing conductor 188. The transition points between the power supply planes and the power sensing conductors establish a voltage sensing point for determining and controlling the amount of power supplied to the DUT 30 (FIG. 3). For example, the positive power supply voltage is sensed at point 190 and the negative power supply voltage is sensed at point 192. The points 190 and 192 are at the furthest distance from the location where power is supplied to the planes 182 and 186 from the D type connector 172 (FIG. 7). Thus, the voltage of each supply plane is sensed at the most remote location from its application source at the D type connector 172, thereby providing the worst case measurement of the voltage present at any location on the supply plane. Sensing the voltage of the power supplies at these points 190 and 192 eliminates any line and connector losses which might adversely affect the voltage sensed.

The size of the power supply planes 182 and 186 is relatively large. A very low inductance and the highest possible capacitance is thereby created, which minimizes the effects of switching induced current transients on the voltage supply. Typical previous cards employed for testing ICs use traces for applying the power which are the same size as the traces used for applying the test signals. Power applying traces of relatively the same size as the traces for applying the test signals can cause the current switching transients to create voltage spikes which appear at the power supply contact pads of the IC under test, thereby creating inaccuracies in the test results.

The fourth layer circuit pattern 200 is shown in FIGS. 7 and 12. The fourth layer circuit pattern 200 contains a plurality of vias (plated through-holes) 202 arranged in a circular pattern at the center of the high frequency probe card 128. These vias pass through to the first circuit pattern layer 140 and join with the contact pads at the inside ends of the traces 142a and 142b (FIGS. 5 and 8). The ends 204 of the probes 114 opposite of the tips 116 extend to the vias 202 where they are lap soldered to the end of the traces 142a and 142b, as shown in FIGS. 5 and 8. The vias 202 on the fourth layer circuit pattern 200 establish test points to allow access to all signals delivered to the probes. Access to these signals at the vias 202 on the fourth layer circuit pattern is very useful for troubleshooting or for manual verification of test results. By providing the vias 202, the coaxial cables 130 do not have to be disconnected from the high frequency probe card 128. This is an important feature, because high bandwidth coaxial SMB connectors are only designed for a limited number of separate mechanical connections and disconnections, and minimizing the number of connections and disconnections will result in a longer life of these connectors.

A ground ring conductor 206 is also included in the fourth circuit layer pattern 200. The ground ring conductor 206 is located concentrically with respect to the test point Vias 202, to enable the relatively easy connection of an osciloscope probe connection. The ground ring conductor 206 is connected to the probes 114 which supply ground reference potential to the DUT by vias 208 which extend between the circuit layer patterns 140 and 200.

Another plurality of vias 210 are arranged in groups 146 of five of the fourth layer circuit pattern 200. Each of these vias 210 receives the mating portion of a conventional slide-on SMB connector 144 (FIG. 4). As was discussed in conjunction with the first layer 140, each SMB connector 144 includes the center signal conductor which is attached to the center via 210 of the group 146, while the four outside vias of the group 146 receive the mounting tabs of the mating portion 144a (FIG. 7) of the SMB connector 144.

The other mating portion 144b of each SMB connector 144 is attached to a mating connector bulkhead 212, shown in FIGS. 4 and 7. The bulkhead 212 is a metal ring which includes holes formed for receiving the other mating portions of the SMB connectors 144 (FIG. 4) which are connectable to those mating portions attached to the fourth layer circuit pattern 200 described above. Thus, the mating portions of the SMB connectors 144 can be connected and disconnected at once. This arrangement reduces setup time and eliminates mis-wiring. SMA or SMC coaxial connectors will not provide this functionality because the mating portions of those connectors connect by threads. The slide-on SMB connectors require a relatively small amount of insertion force, thereby facilitating connection and disconnection.

The D type connector 172 (FIG. 7) is also connected to the fourth layer circuit pattern 200. Vias extend from the fourth layer to the circuit pattern traces on the first, second and third layers by which signals are conducted from the connector 172 to the circuit pattern traces on those layers. An example of the manner in which the pins of the connector 172 are used is as follows. Four of the pins of the connector are each employed for supplying the positive power plane 182 and the negative power plane 186 of the third layer 180 (FIG. 11). Six pins of the connector 172 are employed to conduct current from the ground reference plane 170 (FIG. 10), to reduce contact resistance. Two pins are each connected to the voltage sensing conductors 184 and 188 (FIG. 11), to thereby reduce the chance of a cable opening or disconnecting, and causing a power supply supplying voltage to the power planes to drive to its limit and damage the DUT.

The fourth layer circuit pattern 200 also includes a number of contact pads 214 (FIG. 12) by which to connect external bypass capacitors from the positive and negative power supply vias and planes to ground reference, to thereby increasing power supply filtering.

The probe ring 112 (FIG. 7) preferably includes 52 probes 114, each of which is formed of beryllium copper. The probe ring includes a circular mounting ring 216 which is connected to the laminated printed circuit board structure to which the first layer circuit pattern 140 is a part, as is shown in FIGS. 5 and 6. The mounting ring 210 is connected by an adhesive and the outside ends 204 of the probes 114 are lap soldered to the vias 202. Beryllium copper probes are preferred because of their relatively low contact resistance compared to tungsten probes, and their relatively high durability compared to palladium probes.

By constructing the high frequency probe card 128 as a laminated structure as previously described, the tips 116 of the probes 114 remain in a plane, thereby providing good contact with the contact pads 118 of the DUT 30, as shown in FIG. 5. All of the probe tips contact the contact pads within approximately one mil of movement of the DUT toward the high frequency probe card 128. After contact, the DUT is moved closer toward the high frequency probe card, thereby "overdriving" the probes to maintain the probe tips 116 in good contact with the contact pads 118. If the probe tips are not durable, or if the card 128 bends or distorts during overdrive, some of the probe tips may come out of electrical and physical contact with the contact pads, thereby indicating a malfunctioning DUT, when an electrical discontinuity is actually the problem.

Some of the more significant improvements available from the present invention and a presently preferred embodiment of the present invention have been described with a degree of particularity. It should be understood that this description has been made by way of preferred example, and that the invention is defined by the scope of the following claims.

The invention claimed is:

1. In a digital test system for functionally testing undiced integrated circuits or dies on wafers at relatively high test frequencies, the system having generator means for generating input signals to be applied to a die under test or DUT and also having analyzer means for analyzing response signals supplied by the DUT in response to the input signals to thereby determine if the DUT is functioning properly, the DUT including a plurality of contact pads arranged in a predetermined configuration, an improvement in combination therewith comprising:

a probe card assembly including a plurality of printed circuit boards laminated together as a single laminated structure, a plurality of printed circuit patterns formed on the boards, a first one of the circuit patterns including a plurality of equal length and equal impedance elongated micro strip test signal traces, a second one of the circuit patterns including a relatively large reference plane which extends substantially over the test signal traces and is separated from the test signal traces by a uniform thickness of a circuit board to establish a uniform impedance per unit of length for the test signal traces, a third one of the circuit patterns including a power plane of a size approximately equal to the size or the reference plane, a probe ring having a plurality of resilient probes retained by a mounting ring in a pattern in which tips at one end of the probes are positioned to physically and electrically contact the contact pads of the DUT, the mounting ring attached to the laminated structure, an end of each of the probes opposite the tip electrically connected to the circuit patterns of the laminated structure, the connection end of a majority of the probes electrically connected to the ends of test signal traces, the connection end of each of a plurality of the remaining probes connected to at least one of the power plane and the reference plane, and a plurality of high frequency connectors attached to the laminated structure in electrical contact with the test signal traces at the end thereof opposite the end at which the connection ends are connected; and interface means for electrically conducting the input signals from the generator means to the probe card assembly and for electrically conducting the response signals from the probe card assembly to the analyzer means, the interface means including a plurality of high frequency conductors electrically connected to the high frequency connectors of the probe card assembly for conducting the input and response signals to and from the DUT, respectively.

2. A system as defined in claim 1 further comprising a plurality of vias extending through the laminated structure by which to electrically interconnect the test signal traces and the connection ends of the probes, and wherein the third circuit pattern also includes a sensing conductor extending from the power plane at a sensing point approximately at the location where the vias connect the connection ends of the probes to the power plane.

3. A system as defined in claim 2 wherein the power plane includes a positive power plane and a negative power plane, the vias connect the connection ends of the remaining probes to one of either of the positive and negative power planes, and the third circuit pattern includes a positive and a negative sensing conductor extending from the positive and negative power planes, respectively, at sensing points approximately at the location where the vias connect the connection ends of the probes to the power planes.

4. A system as defined in claim 3 wherein the sensing points are located on the power planes at essentially the most remote location from the point at which the power planes are supplied with power.

5. A system as defined in claim 1 wherein the plurality of high frequency connectors include a first mating portion of the high frequency connector, the plurality of high frequency conductors of the interface means include a second mating portion of the high frequency connector, and the first and second mating portions of each high frequency connector connect by sliding on to one another.

6. A system as defined in claim 5 further comprising a bulkhead means for retaining the second mating portions of the high frequency connectors in a predetermined pattern corresponding to the pattern of the first mating portions of the high frequency connectors attached to the laminated structure, to allow both mating portions of all of the high frequency connectors to connect and separate simultaneously.

7. A system as defined in claim 1 wherein the probes are formed of beryllium copper.

8. A system as defined in claim 1 wherein the interface means comprises an interface card including a plurality of printed circuit boards laminated together as a single laminated structure, the printed circuit boards including printed circuit patterns formed thereon, and the printed circuit patterns include a micro strip portion which forms a portion of an interconnect conductor, the interconnect conductor defined by a portion of a high frequency conductor of the interface means which is electrically connected to the test signal traces of the probe card assembly.

9. In a digital test system for functionally testing undiced integrated circuits or dies on wafers at relatively high test frequencies, the system having generator means for generating input signals to be applied to a die under test or DUT and also having analyzer means for analyzing response signals supplied by the DUT in response to the input signals to thereby determine if the DUT is functioning properly, the DUT including a plurality of contact pads arranged in a predetermined configuration, an improvement in combination therewith comprising:

a probe card assembly including a plurality of printed circuit boards laminated together as a single laminated structure, a plurality of printed circuit patterns formed on the boards, a first one of the circuit patterns including a plurality of equal length and equal impedance elongated micro strip test signal traces, a second one of the circuit patterns including a relatively large reference plane which extends substantially over the test signal traces and is separated from the test signal traces by a uniform thickness of a circuit board to establish a uniform impedance per unit of length for the test signal traces, a third one of the circuit patterns including a power plane of a size approximately equal to the size of the reference plane, a probe ring having a plurality of resilient probes retained by a mounting ring in a pattern in which tips at one end of the probes are positioned to physically and electrically contact the contact pads of the DUT, the mounting ring attached to the laminated structure, an end of each of the probes opposite the tip electrically connected to the circuit patterns of the laminated structure, the connection end of a majority of the probes electrically connected to the ends of test signal traces, the connection ends of each of a plurality of the remaining probes connected to at least one of the power plane and the reference plane, and a plurality of high frequency conductors attached to the laminated structure in electrical contact with the test signal traces at the end thereof opposite the end at which the connection ends are connected; and interface means for electrically conducting the input signals from the generator means to the probe card assembly and for electrically conducting the response signals from the probe card assembly to the analyzer means, the interface means including a plurality of high frequency conductors electrically connected to the high frequency connectors of the probe card assembly for conducting the input and response signals to and from the DUT, respectively; and wherein:

the first circuit pattern includes a power divider means formed by micro strip traces, the power divider means receiving a test clock signal having a predetermined frequency from the interface means and in response thereto supplying a pair of DUT clock signals of approximately equal power.

10. A system as defined in claim 9 wherein the power divider means further adds a reflected signal of approximately equal amplitude to a primary signal derived by the power divider means to establish the power of each of the DUT clock signals at a level of approximately twice the power of the primary signal.

11. A system as defined in claim 9 wherein the first circuit pattern further includes a 180 degree phase delay means formed by a micro strip trace which is connected to receive one of the DUT clock signals and phase shift the one DUT clock signal by 180 degrees relative to the other DUT clock signal.

12. A system as defined in claim 11 wherein the power divider means comprises first and second micro strip branches which each have a length of one-fourth of the wavelength of the predetermined frequency of the test clock signal, the micro strip trace forming the phase delay means is connected to the terminal end of the second branch, and the two DUT clock signals form a true and a complement DUT clock signal which are respectively present at the terminal end of the first branch and at the terminal end of the micro strip trace forming the phase delay means.

13. A system as defined in claim 1 further comprising a plurality of vias extending through the laminated structure, and wherein the test signal traces and the connection ends of the probes are electrically interconnected at said vias to allow said vias to conduct the input and response signals to and from said probes, respectively.

14. In a digital test system for functionally testing undiced integrated circuits or dies on wafers at relatively high test frequencies, the system having generator means for generating input signals to be applied to a die under test or DUT and also having analyzer means for analyzing response signals supplied by the DUT in response to the input signals to thereby determine if the DUT is functioning properly, the DUT including a plurality of contact pads arranged in a predetermined configuration, an improvement in combination therewith comprising:

a probe card assembly including a plurality of printed circuit boards laminated together as a single laminated structure, a plurality of printed circuit patterns formed on the boards, a first one of the circuit patterns including a plurality of equal length and equal impedance elongated micro strip test signal traces, a second one of the circuit patterns including a relatively large reference plane which extends substantially over the test signal traces and is separated from the test signal traces by a uniform thickness of a circuit board to establish a uniform impedance per unit of length for the test signal traces, a third one of the circuit patterns including a power plane of a size approximately equal to the size of the reference plane, a probe ring having a plurality of resilient probes retained by a mounting ring in a pattern in which tips at one end of the probes are positioned to physically and electrically contact the contact pads of the DUT, the mounting ring attached to the laminated structure, an end of each of the probes opposite the tip electrically connected to the circuit patterns of the laminated structure, the connection end of a majority of the probes electrically connected to the ends of test signal traces, the connection end of each of a plurality of the remaining probes connected to at least one of the power plane and the reference plane, and a plurality of high frequency connectors attached to the laminated structure in electrical contact with the test signal traces at the end thereof opposite the end at which the connection ends are connected; and interface means for electrically conducting the input signals from the generator means to the probe card assembly and for electrically conducting the response signals from the probe card assembly to the analyzer means, the interface means including a plurality of high frequency conductors electrically connected to the high frequency connectors of the probe card assembly for conducting the input and response signals to and from the DUT, respectively; and wherein:

the high frequency conductors of the interface means include interconnect conductors electrically connected to the high frequency connectors connected to the test signal traces of the probe card assembly, and the interface means comprises a plurality of selection switch means by which to selectively alternatively connect each interconnect conductor to either receive the input signal from the generator means or to transmit the response signal to the analyzer means.

15. A system as defined in claim 14 wherein the selection switch means includes a terminal at which the input signal from the generator means is received, and further comprises a terminating impedance means for maintaining the strength of the input signal at said selection switch means.

16. A system as defined in claim 14 further comprising computer means for operatively controlling the operation of the generator means and the analyzer means by delivering control signals, and wherein the interface means further comprises switch control means receptive of a control signal from the computer means and operative in response thereto for signalling the selection switch means to change the state of its selective alternative connection.

17. A system as defined in claim 16 wherein the selection switch means comprises a GaAs switch, the switch control means comprises a comparator, and the interface means comprises an interface card including a plurality of printed circuit boards laminated together as a single laminated structure, the printed circuit boards including printed circuit patterns formed thereon, and the printed circuit patterns define the selection switch means, the control switch means, the impedance means and the interconnect conductor.

18. In a digital test system for functionally testing undiced integrated circuits or dies on wafers at relatively high test frequencies, the system having generator means for generating input signals to be applied to a die under test or DUT and also having analyzer means for analyzing response signals supplied by the DUT in response to the input signals to thereby determine if the DUT is functioning properly, the DUT including a plurality of contact pads arranged in a predetermined configuration, an improvement in combination therewith comprising:

a probe card assembly including a plurality of printed circuit boards laminated together as a single laminated structure, a plurality of printed circuit patterns formed on the boards, a first one of the circuit patterns including a plurality of equal length and equal impedance elongated micro strip test signal traces, a second one of the circuit patterns including a relatively large reference plane which extends substantially over the test signal traces and is separated from the test signal traces by a uniform thickness of a circuit board to establish a uniform impedance per unit of length for the test signal traces, a third one of the circuit patterns including a power plane of a size approximately equal to the size of the reference plane, a probe ring having a plurality of resilient probes retained by a mounting ring in a pattern in which tips at one end of the probes are positioned to physically and electrically contact the contact pads of the DUT, the mounting ring attached to the laminated structure, an end of each of the probes opposite the tip electrically connected to the circuit patterns of the laminated structure, the connection end of a majority of the probes electrically connected to the ends of test signal traces, the connection end of each of a plurality of the remaining probes connected to at least one of the power plane and the reference plane, and a plurality of high frequency connectors attached to the laminated structure in electrical contact with the test signal traces at the end thereof opposite the end at which the connection ends are connected;

clock means for generating a system clock signal at a predetermined frequency; and interface means for electrically conducting the input signals from the generator means to the probe card assembly and for electrically conducting the response signals from the probe card assembly to the analyzer means, the interface means further connected to the clock means and receptive of the system clock signal; the interface means including a plurality of high frequency conductors electrically connected to the high frequency conductors of the probe card assembly for conducting the input and response signals to and from the DUT, respectively, directional coupler means for generating a coupled signal at the frequency of the system clock signal, and divider means receptive of the coupled signal and operative in response thereto for deriving a clock signal having a frequency which is an integer division of the frequency of the system clock signal, the interface means further electrically conducting the clock signal to the generator and analyzer means to synchronize operation of the generator means and the analyzer means.

19. A system as defined in claim 18 further comprising bias means for adding a DC bias level signal to the coupled signal prior to receipt thereof by the divider means, and wherein the divider means comprises a flip flop.

20. A system as defined in claim 19 wherein the interface means comprises an interface card including a plurality of printed circuit boards laminated together as a single laminated structure, the printed circuit boards including printed circuit patterns formed thereon, and the printed circuit patterns include a micro strip portion which forms the directional coupler means, another portion which forms the divider means, another micro strip portion which supplies the system clock signal to the probe card assembly, and a further micro strip portion which conducts the clock signal which is received by the generator means and the analyzer means.

21. A method of functionally testing undiced integrated circuits or dies on wafers at relatively high test frequencies using a digital test system having a generator for generating input signals to be applied to a die under test or DUT and also having an analyzer for analyzing response signals supplied by the DUT in response to the input signals to thereby determine if the DUT is functioning properly, the DUT including a plurality of contact pads arranged in a predetermined configuration, said method comprising the steps of:

physically and electrically contacting the contact pads of the DUT with a plurality of resilient probes retained in a pattern in which tips at one end of the probes are positioned to align with the contact pads;

laminating a plurality of printed circuit boards together as a single laminated structure in which a plurality of printed circuit patterns are formed on the boards;

forming a plurality of equal length and equal impedance elongated micro strip test signal traces on a first one of the circuit patterns;

forming a reference plane which extends substantially over the test signal traces and is separated from the test signal traces by a uniform thickness of a circuit board to establish a uniform impedance per unit of length for the test signal traces on a second one of the circuit patterns, the reference plane being relatively larger than the test signal traces;

forming a power plane of a size approximately equal to the size of the reference plane on a third one of the circuit patterns;

electrically connecting each of the probes at a connection end opposite the tip to the circuit patterns of the laminated structure, with a majority of the probes electrically connected to the ends of the test signal traces, and with a plurality of the remaining probes connected to at least one of the power plane and the reference plane;

attaching a plurality of high frequency conductors to the laminated structure in electrical contact with the test signal traces at the end thereof opposite the end at which the connection ends of the probes are connected;

electrically conducting input signals from the generator through the high frequency conductors to the test signal traces; and electrically conducting the response signals from the DUT to the analyzer through the high frequency conductors.

22. A method as defined in claim 21 further comprising:

extending a plurality of vias through the laminated structure to electrically interconnect the test signal traces and the connection ends of the majority of the probes and to electrically interconnect the plurality of remaining probes at the connection ends to the power plane and reference plane; and including a sensing conductor in the third circuit pattern, the sensing conductor extending from the power plane at a sensing point located approximately where the vias connect the connection ends of the probes to the power plane.

23. A method as defined in claim 22 further comprising:

supplying the power plane with power; and locating the sensing point on the power plane at essentially the most remote location from the point at which the power plane is supplied with power.

24. A method as defined in claim 21 further comprising:

attaching a first mating portion of each of the plurality of high frequency conductors to the laminated structure in electrical contact with the test signal traces at the end thereof opposite the end at which the connection ends are connected;

attaching a second mating portion of each of the plurality of high frequency conductors to a bulkhead in a predetermined pattern corresponding to the pattern of the first mating portions connected to the laminated structure, to allow both mating portions connectors to connect and separate simultaneously by sliding onto and off of each other, respectively.

25. A method as defined in claim 21 further comprising:

extending a plurality of vias through the laminated structure to electrically connect with the connection ends of the probes; and sensing the signals from said probes at the vias.

26. A method as defined in claim 21 further comprising:

forming a portion of each high frequency conductor as an interconnect conductor;

connecting each interconnect conductor to a test signal trace;

selectively alternatively connecting said interconnect conductor to either receive the input signal from the generator or to transmit the response signal to the analyzer.

27. A method as defined in claim 26 further comprising:

utilizing a plurality of selection switches by which to selectively alternatively connect each interconnect conductor;

operatively controlling the operation of the generator and the analyzer by delivering control signals thereto; and operatively controlling the selection switch to change the state of its selective alternative connection by delivering control signals thereto.

28. A method of functionally testing undiced integrated circuits or dies on wafers at relatively high test frequencies using a digital test system having a generator for generating input signals to be applied to a die under test or DUT and also having an analyzer for analyzing response signals supplied by the DUT in response to the input signals to thereby determine if the DUT is functioning properly, the DUT including a plurality of contact pads arranged in a predetermined configuration, said method comprising the steps of:

physically and electrically contacting the contact pads of the DUT with a plurality of resilient probes retained in a pattern in which tips at one end of the probes are positioned to align with the contact pads;

laminating a plurality of printed circuit boards together as a single laminated structure in which a plurality of printed circuit patterns are formed on the boards;

forming a plurality of equal length and equal impedance elongated micro strip test signal traces on a first one of the circuit patterns;

forming a power divider on the first circuit pattern using micro strip traces;

forming a reference plane which extends substantially over the test signal traces and is separated from the test signal traces by a uniform thickness of a circuit board to establish a uniform impedance per unit of length for the test signal traces on a second one of the circuit patterns, the reference plane being relatively larger than the test signal traces;

forming a power plane of a size approximately equal to the size of the reference plane on a third one of the circuit patterns;

electrically connecting each of the probes at a connection end opposite the tip to the circuit patterns of the laminated structure, with a majority of the probes electrically connected to the ends of the test signal traces, and with a plurality of the remaining probes connected to at least one of the power plane and the reference plane;

attaching a plurality of high frequency conductors to the laminated structure in electrical contact with the test signal traces at the end thereof opposite the end at which the connection ends of the probes are connected;

electrically conducting input signals from the generator through the high frequency conductors to the test signal traces;

supplying a test clock signal having a predetermined frequency to the power divider;

supplying a pair of DUT clock signals of approximately equal power by operation of the power divider in response to the test clock signal; and electrically conducting the response signals from the DUT to the analyzer through the high frequency conductors.

29. A method as defined in claim 28 further comprising:

obtaining a primary signal component of each DUT clock signal by operation of the power divider in response to the test clock signal;

obtaining a reflected signal component of each DUT clock signal of approximately equal amplitude to the primary signal component by reflection of the primary signal component during operation of the power divider;

adding the reflected signal component to the primary signal component to establish the power of each of the DUT clock signals at a level of approximately twice the power of the primary signal component.

30. A method as defined in claim 29 further comprising:

forming a 180 degree phase delay using a micro strip trace;

connecting the phase delay to receive a DUT clock signal;

phase shifting the DUT clock signal conducted through the phase delay by 180 degrees to establish one DUT signal.

31. A method as defined in claim 30 further comprising:

forming first and second micro strip branches on the power divider which each have a length of one-fourth of the wavelength of the predetermined frequency of the test clock signal;

connecting the micro strip trace forming the phase delay to the terminal end of the second branch; and supplying a true DUT clock signal and a complement DUT clock signal at the terminal end of the first branch and at the terminal end of the micro strip trace forming the phase delay, respectively.

32. A method of functionally testing undiced integrated circuits or dies on wafers at relatively high test frequencies using a digital test system having a generator for generating input signals to be applied to a die under test or DUT and also having an analyzer for analyzing response signals supplied by the DUT in response to the input signals to thereby determine if the DUT is functioning properly, the DUT including a plurality of contact pads arranged in a predetermined configuration, said method comprising the steps of:

physically and electrically contacting the contact pads of the DUT with a plurality of resilient probes retained in a pattern in which tips at one end of the probes are positioned to align with the contact pads;

laminating a plurality of printed circuit boards together as a single laminated structure in which a plurality of printed circuit patterns are formed on the boards;

forming a plurality of equal length and equal impedance elongated micro strip test signals traces on a first one of the circuit patterns;

forming a reference plane which extends substantially over the test signal traces and is separated from the test signal traces by a uniform thickness of a circuit board to establish a uniform impedance per unit of length for the test signal traces on a second one of the circuit patterns, the reference plane being relatively larger than the test signal traces;

forming a power plane of a size approximately equal to the size of the reference plane on a third one of the circuit patterns;

electrically connecting each of the probes at a connection end opposite the tip to the circuit patterns of the laminated structure, with a majority of the probes electrically connected to the ends of the test signal traces, and with a plurality of the remaining probes connected to at least one of the power plane and the reference plane;

attaching a plurality of high frequency conductors to the laminated structure in electrical contact with the test signal traces at the end thereof opposite the end at which the connection ends of the probes are connected;

generating a system clock signal at a predetermined frequency;

utilizing a directional coupler for generating an coupled signal at the frequency of the system clock signal;

supplying the coupled signal to a divider;

deriving a clock signal from the divider in response to the coupled signal, the clock signal having a frequency which is an integer division of the frequency of the system clock signal;

synchronizing the operation of the generator and analyzer by supplying the clock signal thereto;

electrically conducting input signals from the generator through the high frequency conductors to the test signal traces; and electrically conducting the response signals from the DUT to the analyzer through the high frequency conductors.

33. In a digital test system for functionally testing undiced integrated circuits or dies on wafers at relatively high test frequencies, the system having generator means for generating input signals to be applied to a die under test or DUT and also having analyzer means for analyzing response signals supplied by the DUT in response to the input signals to thereby determine of the DUT is functioning properly, the DUT including a plurality of contact pads arranged in a predetermined configuration, an improvement in combination therewith comprising:

a probe card assembly including a plurality of printed circuit boards laminated together as a single laminated structure, a plurality of printed circuit patterns formed on the boards, a first one of the circuit patterns including a plurality of equal length and equal impedance elongated micro strip test signal traces, a second one of the circuit patterns including a relatively large reference plane which extends substantially over the test signal traces and is separated from the test signal traces by a uniform thickness of a circuit board to establish a uniform impedance per unit of length for the test signal traces, a third one of the circuit patterns including a positive power plane and a negative power plane which have a combined size approximately equal to the size of the reference plane, a probe ring having a plurality of resilient probes retained by a mounting ring in a pattern in which tips at one end of the probes are positioned to physically and electrically contact the contact pads of the DUT, the mounting ring attached to the laminated structure, an end of each of the probes opposite the tip electrically connected to the circuit patterns of the laminated structure, the connection end of a majority of the probes electrically connected to the ends of test signal traces, the connection end of each of a plurality of the remaining probes connected to one of the positive power plane, the negative power plane or the reference plane, the third circuit pattern also including a positive sensing conductor and a negative sensing conductor respectively extending from the positive and negative power planes at sensing points approximately at the location where the connection ends of the remaining probes connect to the power planes, and a plurality of high frequency connectors attached to the laminated structure in electrical contact with the test signal traces at the end thereof opposite the end at which the connection ends are connected; and integrated means for electrically conducting the input signals from the generator means to the probe card assembly and for electrically conducting the response signals from the probe card assembly to the analyzer means, the interface means including a plurality of high frequency conductors electrically connected to the high frequency connectors of the probe card assembly for conducting the input and response signals to and from the DUT, respectively.

34. A system as defined in claim 33 wherein the sensing points are located on the power planes at essentially the most remote location from the point at which the power planes are supplied with power.

35. A method of functionally testing undiced integrated circuits or dies on wafers at relatively high test frequencies using a digital test system having a generator for generating input signals to be applied to a die under test or DUT and also having an analyzer for analyzing response signals supplied by the DUT in response to the input signals to thereby determine if the DUT is functioning properly, the DUT including a plurality of contact pads arranged in a predetermined configuration, said method comprising the steps of:

physically and electrically contacting the contact pads of the DUT with a plurality of resilient probes retained in a pattern in which tips at one end of the probes are positioned to align with the contact pads;

laminating a plurality of printed circuit boards together as a single laminated structure in which a plurality of printed circuit patterns are formed on the boards;

forming a plurality of equal length and equal impedance elongated micro strip test signal traces on a first one of the circuit patterns;

forming a reference plane which extends substantially over the test signal traces and is separated from the test signal traces by a uniform thickness of a circuit board to establish a uniform impedance per unit of length for the test signal traces on a second one of the circuit patterns, the reference plane being relatively larger than the test signal traces;

forming a power plane of a size approximately equal to the size of the reference plane on a third one of the circuit patterns;

electrically connecting each of the probes at a connection end opposite the tip to the circuit patterns of the laminated structure, with a majority of the probes electrically connected to the ends of the test signal traces, and with a plurality of remaining probes connected to at least one of the power plane and the reference plane;

supplying electrical power to the power plane at a power supply location;

including a sensing conductor in the third circuit pattern, the sensing conductor extending from the power plane at a sensing point located approximately where the connection ends of the probes are connected to the power plane, the sensing point located on the power plane at essentially the most remote location from the power supply location;

attaching a plurality of high frequency conductors to the laminated structure in electrical contact with the test signal traces at the end thereof opposite the end at which the connection ends of the probes are connected;

electrically conducting input signals from the generator through the high frequency conductors to the test signal traces; and electrically conducting the response signals from the DUT to the analyzer through the high frequency conductors.

36. A method of functionally testing undiced integrated circuits or dies on wafers at relatively high test frequencies using a digital test system having a generator for generating input signals to be applied to a die under test or DUT and also having an analyzer for analyzing response signals supplied by the DUT in response to the input signals to thereby determine if the DUT is functioning properly, the DUT including a plurality of contact pads arranged in a predetermined configuration, said method comprising the steps of:

physically and electrically contacting the contact pads of the DUT with a plurality of resilient probes retained in a pattern in which tips at one end of the probes are positioned to align with the contact pads;

laminating a plurality of printed circuit boards together as a single laminated structure in which a plurality of printed circuit patterns are formed on the boards;

forming a plurality of equal length and equal impedance elongated micro strip test signal traces on a first one of the circuit patterns;

forming a reference plane which extends substantially over the test signal traces and is separated from the test signal traces by a uniform thickness of a circuit board to establish a uniform impedance per unit of length for the test signal traces on a second one of the circuit patterns, the reference plane being relatively larger than the test signal traces;

forming a power plane of a size approximately equal to the size of the reference plane on a third one of the circuit patterns;

electrically connecting each of the probes at a connection end opposite the tip to the circuit patterns of the laminated structure, with a majority of the probes electrically connected to the ends of the test signal traces, and with a plurality of the remaining probes connected to at least one of the power plane and the reference plane;

attaching a plurality of high frequency conductors to the laminated structure in electrical contact with the test signal traces at the end thereof opposite the end at which the connection ends of the probes are connected;

selectively alternatively connecting each of a plurality of high frequency conductors to either receive an input signal from the generator or to transmit a response signal to the analyzer;

utilizing a plurality of selection switches by which to selectively alternatively connect each of the plurality of high frequency conductors;

operatively controlling the operation of the generator and the analyzer by delivering control signals thereto;

operatively controlling the selection switch to change the state of its selective alternative connection by delivering control signals thereto;

electrically conducting the input signals to the DUT from the generator through the ones of the plurality of high frequency conductors connected to receive the input signal from the generator; and electrically conducting the response signals to the analyzer from the DUT through the ones of the plurality of high frequency conductors connected to transmit the response signal to the analyzer.

* * * * *